(12) United States Patent
Hogyoku

(10) Patent No.: US 7,093,214 B2
(45) Date of Patent: Aug. 15, 2006

(54) METHODS OF EXTRACTING SPICE PARAMETERS, PERFORMING A SPICE CALCULATION, AND PERFORMING DEVICE SIMULATION FOR A PARTIALLY-DEPLETED SOI MOSFET

(75) Inventor: Michiru Hogyoku, Nagano-ken (JP)

(73) Assignee: Seiko Epson Corporation, (JP)

( * ) Notice: Subject to any disclaimer, the term of this patent is extended or adjusted under 35 U.S.C. 154(b) by 302 days.

(21) Appl. No.: 10/720,740

(22) Filed: Nov. 24, 2003

(65) Prior Publication Data
US 2005/0055191 A1 Mar. 10, 2005

(30) Foreign Application Priority Data
Nov. 28, 2002 (JP) .......................... 2002-345823

(51) Int. Cl.
*G06F 17/50* (2006.01)
(52) U.S. Cl. ............................. 716/4; 716/5
(58) Field of Classification Search ............... 716/4–5, 716/18, 3; 703/13–14
See application file for complete search history.

(56) References Cited

U.S. PATENT DOCUMENTS 6,442,735 B1 * 8/2002 Joshi et al. ............... 716/4
6,567,773 B1 * 5/2003 Rahmat et al. ............ 703/14

OTHER PUBLICATIONS

Andy Wei, Melanie J. Sherony, Dimitri A. Antoniadis, "Effect of Floating-Body Charge on SOI MOSFET Design", vol. 45, No. 2, IEEE Transactions on Electron Devices, Feb. 1998.

* cited by examiner

*Primary Examiner*—Paul Dinh
(74) *Attorney, Agent, or Firm*—Harness, Dickey & Pierce, P.L.C.

(57) ABSTRACT

Procedures for SPICE parameter extraction, SPICE calculation, and device simulation for a partially depleted SOI MOSFET are provided. First, SPICE calculation parameters are set. At cthis time, parameters that describe the body current characteristics are not extracted but rather the body current is estimated to be zero. Then, in place of parameters that describe the body current characteristics, information regarding the steady state during circuit operation that is normally found from the body current characteristics, which is to say, the body charge and oscillation in the body potential, is treated as macro parameters that encompass information regarding the body current characteristics. After setting the parameters that include such macro parameters, a SPICE calculation for transient analysis is performed.

2 Claims, 4 Drawing Sheets

METHODS OF EXTRACTING SPICE PARAMETERS, PERFORMING A SPICE CALCULATION, AND PERFORMING DEVICE SIMULATION FOR A PARTIALLY-DEPLETED SOI MOSFET

BACKGROUND OF THE INVENTION

1. Field of the Invention

The present invention relates to a MOSFET formed on an SOI (Silicon On Insulator) substrate, and in particular to a method of detecting SPICE (Simulation Program With Integrated Circuit Emphasis) parameters, performing a SPICE calculation, and performing device simulation for a partially depleted SOI MOSFET where the body is only partially depleted.

2. Related Art

An SOI MOSFET is a MOSFET constructed in a single silicon crystal formed on an insulator film called an SOI (Silicon On Insulator) substrate. In particular, in a partially depleted SOI MOSFET with a floating body effect, each component of the currents that flow into a body current and causes changes in the amount of body charge (such currents are collectively referred to as the "body current") is extremely small, which means that the fluctuations in the body charge are also extremely small. This means that during circuit operation, capacitive coupling occurs between the body and each of the nodes, i.e., the gate, the source, the drain, and the back gate. It is also known that with methods where a MOSFET is operated by providing a terminal on the body and fixing the potential, capacitive coupling occurs in the same way when the body or body terminal resistance and circuit operating frequency are both sufficiently high.

In this way, in an SOI MOSFET where capacitive coupling occurs in the body, during actual circuit operation, the total body charge affects not only the body potential but also the effective drain current characteristics. Naturally, when the effective drain current characteristics are estimated by performing device simulation and a SPICE calculation, it is necessary to calculate the total body charge during circuit operation.

An article by A. Wei et al. in IEEE Trans. Electron Devices, vol. 45, pp. 430–438, 1998 discloses a method of calculating, through device simulation, the total body charge of an SOI MOSFET during circuit operation.

In SPICE calculations of an SOI MOSFET, it is normally thought necessary to prepare models that reproduce the body current, that is, a diode current, an impact ionization current, and a tunnel current resulting in gate induced drain leakage (GIDL), and the capacitance-voltage characteristics (or charge-voltage characteristics) of the body.

For example, kinks that appear in the SOI MOSFET static characteristics (the output characteristics and the sub-threshold characteristics) are understood as a phenomenon where the potential of the body increases due to the impact ionization current. In order to reproduce this kink phenomenon in simulations, models of the current-voltage characteristics for the body current and body capacitance-voltage characteristics have been implemented in the standard models that are presently available (the SOI version of BSIM3 called "BSIMPD" by UC Berkeley and UFSOI by U. Florida, etc.).

However, with regard to models of the current-voltage and capacitance-voltage characteristics for the body (substrate) that are not so important in conventional bulk-MOSFET techniques, the need to perform a procedure for estimating and calculating coefficients for specifying the details of these models in keeping with actual device characteristics presents a considerable burden.

Since the body current that is an origin of the fluctuation in the total body charge during actual circuit operation is extremely small, after sufficient repetition of switching operations, the total charge of the body converges on a state where the charge fluctuates slightly about a certain value. During circuit simulation, it is necessary to calculate the convergence value for the total body charge in advance and to set this calculated value as the initial value for simulation. In addition, since the absolute value of the body current is an order of magnitude smaller than that of the driving current, the calculation of the total body charge and moreover the potential need to be calculated with high accuracy such that there are inevitable compromises between the time taken for the calculation (calculation time) and the degree of reliability of the convergence.

When performing circuit analysis on a partially depleted SOI MOSFET, it is necessary to estimate and calculate coefficients that determine the details of models of the current-voltage and capacitance-voltage characteristics for the body in order to meet actual characteristics, and to perform a procedure for calculating in advance the convergence value of the total body charge during circuit operation. That is, the procedure for extracting the SPICE parameters and performing a SPICE calculation is complex. While the calculations of the total charge and moreover the potential of the body need to be performed with high accuracy, the calculation time and convergence unavoidably have to be prioritized, so a compromise is made to the calculation accuracy.

The present invention was conceived in view of the situation described above, and attempts to increase the efficiency of the procedures for SPICE parameter extraction, SPICE calculations, and device simulation for a partially depleted SOI MOSFET.

SUMMARY

A method of extracting SPICE parameters and performing a SPICE calculation according to the present invention relates to a partially depleted SOI MOSFET formed on an SOI substrate, wherein a body current is not modeled and is estimated at zero, and information regarding a steady state during circuit operation is treated as macro parameters that encompass, on a macro level, amounts that are originally to be found, thereby omitting an extraction of parameters relating to the body current and a calculation that finds the steady state during circuit operation.

A method of performing a SPICE calculation for a partially depleted SOI MOSFET according to the present invention relates to a partially depleted SOI MOSFET formed on an SOI substrate, wherein a body current is estimated at zero and information regarding a steady state during circuit operation is treated as macro parameters that encompass, on a macro level, amounts that are originally to be found, thereby omitting a procedure for a calculation that finds the steady state during circuit operation.

According to the respective methods of extracting SPICE parameters and performing a SPICE calculation for a partially depleted SOI MOSFET in accordance with the present invention described above, information in the steady state during circuit operation is intentionally treated as macro parameters instead of being found from the body current characteristics according to customary principles. By doing so, it is possible to omit an extraction of the SPICE parameters relating to the body current and a calculation that finds the steady state during circuit operation. This can be regarded as a reasonable means in view of the tradeoff between the calculation accuracy and the calculation time and convergence, which originates from the absolute value of the body current being small.

A method of performing a SPICE calculation and device simulation according to the present invention relates to a partially depleted SOI MOSFET formed on an SOI substrate, wherein an input signal cycle and an output load capacitance or an output load resistance are all increased by a same ratio "X", an initial value "Y" of a total body charge at which there is zero fluctuation in the total body charge after one input signal cycle is found in advance, and a value of Y for when X=1 is extrapolated by expressing Y as a function of X, thereby finding a steady state during circuit operation of a partially depleted SOI MOSFET.

A method of performing a SPICE calculation and device simulation according to the present invention relates to a partially depleted SOI MOSFET formed on an SOI substrate, wherein a cycle of trial pulses that imitate actual circuit operation is increased by "X" times to extend the trial pulses with similarity waveforms, an initial value "Y" of a total body charge at which there is zero fluctuation in the total body charge after one trial pulse cycle is found in advance, and a value of Y for when X=1 is extrapolated by expressing Y as a function of X, thereby finding a steady state during circuit operation of a partially depleted SOI MOSFET.

According to the respective methods of performing a SPICE calculation and device simulation for a partially depleted SOI MOSFET in accordance with the present invention described above, only the cycle is increased by X times without changing the history pattern of the oscillations in the bias conditions. It is known that the initial value "Y" of the total body charge at which there is zero fluctuation in the total body charge after one cycle of the input signal is highly dependent on only the history pattern of the oscillations in the bias conditions. That is, the X dependency of the value Y is extremely small, which suggests that it will be extremely easy to extrapolate the value of Y for when X=1. Also, increasing the cycle of the oscillations in the bias conditions by X times means that the accuracy of the calculation of the total body charge is also increased by X times. Accordingly, the accuracy of the calculation can be increased without increasing the calculation time and the load of the calculation procedure.

A method of performing a SPICE calculation according to the present invention relates to a partially depleted SOI MOSFET formed on an SOI substrate, wherein both special values set with lower than a normal magnitude for calculation for a body, and values set with a normal magnitude that is used in a calculation for nodes aside from the body are utilized as error tolerance parameters used as a convergence criterion.

According to the method of performing a SPICE calculation for a partially depleted SOI MOSFET in accordance with the present invention described above, it is possible to perform a high accuracy calculation only for the body. By doing so, it is possible to cope with a situation when the body current and moreover the fluctuations in total body charge are extremely small and when it is necessary to perform the calculation of the total body charge and moreover the body potential with high accuracy. At the same time, since the calculation of the charging and discharging by the driving current at nodes aside from the body can be performed with normal accuracy, this method is more efficient than calculating all of the nodes, including the body, with high accuracy.

A method of performing a SPICE calculation for a partially depleted SOI MOSFET according to the present invention relates to a partially depleted SOI MOSFET formed on an SOI substrate, wherein for a partially depleted SOI MOSFET which is provided with a body terminal and whose effective channel width is known, when body potential dependence of drain current characteristics in the steady state is measured and modeled, a body potential—a value at which a drain current per unit effective channel width matches that in a steady state of a floating body partially depleted SOI MOSFET whose effective channel width is known—is found in advance directly or by interpolation/extrapolation, and the body potential is tabularized and used in analysis of the steady state for the floating body partially depleted SOI MOSFET.

According to the method of performing a SPICE calculation for a partially depleted SOI MOSFET in accordance with the present invention described above, it is possible to find the body potential in the steady state even in cases where the body current is not modeled.

DETAILED DESCRIPTION

Figure 1:
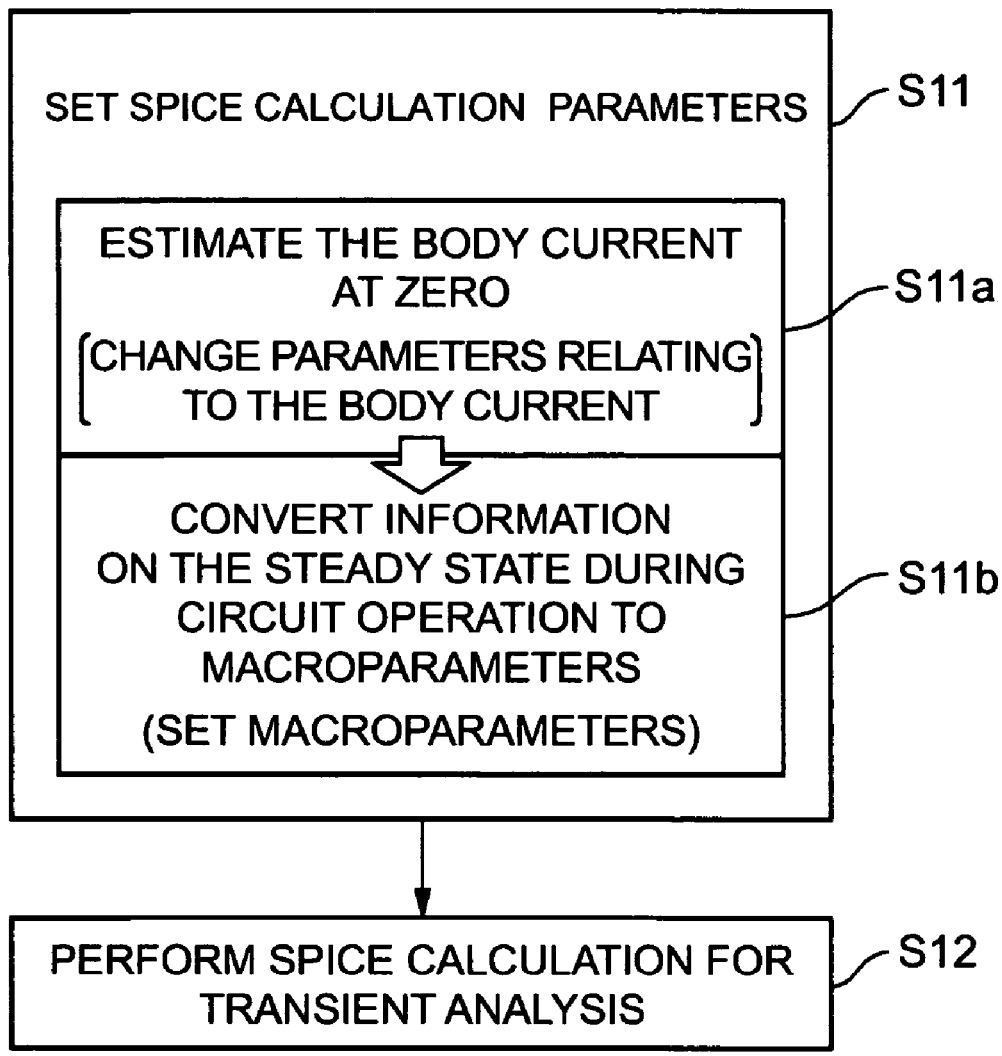
FIG. 1 is a flowchart showing a method of performing a SPICE calculation for a partially depleted SOI MOSFET according to the first embodiment of the present invention.

FIG. 1 is a flowchart showing a method of extracting SPICE parameters and performing a SPICE calculation for a partially depleted SOI MOSFET according to a first embodiment of the present invention.

Figure 4:
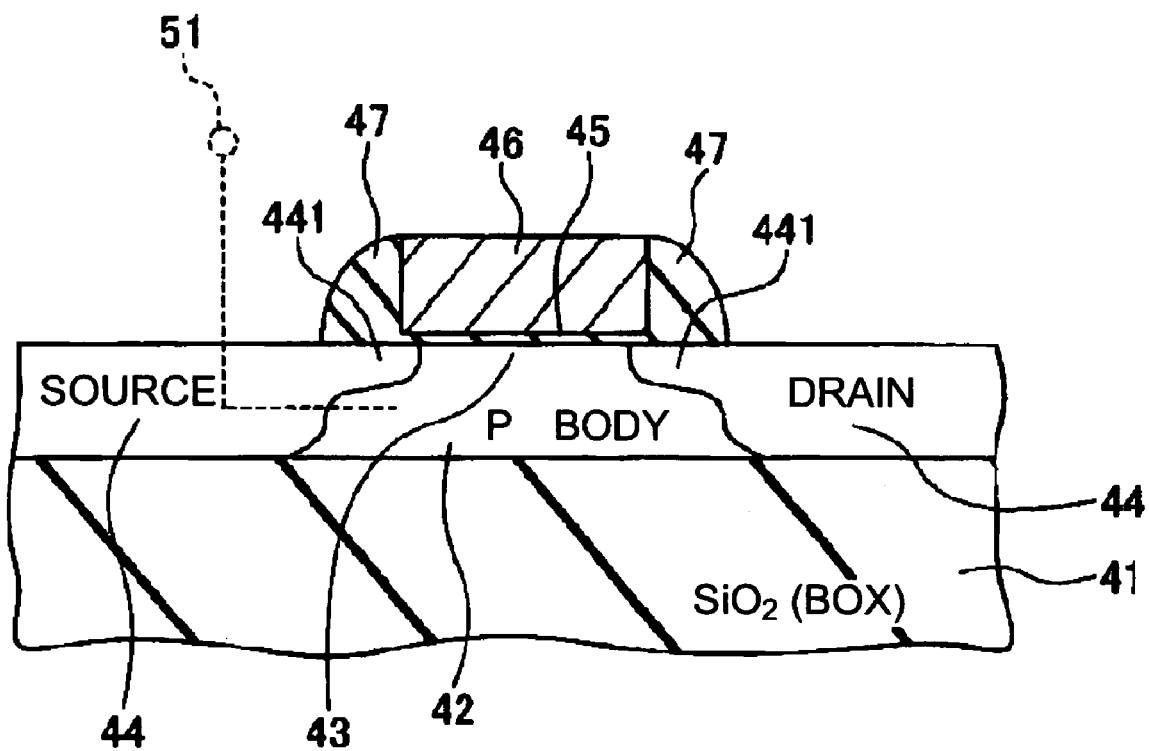
FIG. 4 is a cross-sectional drawing showing a partially depleted SOI MOSFET.

FIG. 4 is a simplified cross-sectional drawing showing a partially depleted SOI MOSFET. A single silicon crystal is formed on an SiO$_2$ film 41 called a "buried oxide film" or "box layer", and it comprises a p-type body 42 and an n-type source/drain region 44 and a channel 43 for example. A gate electrode 46 is constructed on the channel 43 via a gate oxide film 45. Side walls (spacers) 47 are formed on both sides of the gate electrode 46 after forming an N-type extension region 441 with a lower concentration than the source/drain region 44. The above describes a floating body partially depleted SOI MOSFET. The broken line in FIG. 4 shows the construction of a partially depleted SOI MOSFET in the case where a body terminal 51, i.e., a terminal that extends out of the body 42, is provided.

In the present invention, a model is produced for the electrical characteristics of a partially depleted SOI MOSFET in a steady state during circuit operation. The expression "steady state during circuit operation" refers to a state where the body charge does not change even after one cycle of the circuit operation. If Qb is the body charge, the following expression can be defined:

$$Q_{b(t+tp)} - Q_{b(t)} = 0 \quad (1).$$

Here, Qb(t) represents the body charge at an arbitrary time t. Also, tp represents one cycle of the circuit operation.

In FIG. 1, first predetermined parameters, such as extracted parameters that describe the electrical characteristics of a partially depleted SOI MOSFET, a condition regarding the supply voltages and input signals that are based on a predetermined circuit, and error tolerance parameters that are used when judging convergence for the SPICE calculation, are set in conformity with a corresponding descriptive style (process S11). However, at this time, the fluctuations in the body charge that are observed in one cycle of actual circuit operation are thought to be sufficiently small, so that parameters describing the body current characteristics are not extracted and the body current is estimated at zero (process S11a). The parameters that relate to the body current include, as examples, parameters relating to a diode current, parameters relating to a parasitic BJT (Bipolar Junction Transistor) current, parameters relating to an impact-ionization current, and parameters relating to a GIDL current.

Then, in place of the parameters that describe the body current characteristics, information in the steady state during circuit operation that is normally found from the body current characteristics, which is to say, the body charge and oscillation in the body potential, is treated as macro parameters that encompass information on the body current characteristics (process S11b). After setting parameters including such macro parameters, a SPICE calculation for transient analysis is performed (process S12). It is noted that each macro parameter should be determined from corresponding input information for the SPICE calculation by using interpolation and/or extrapolation.

With the method of the present embodiment described above, information regarding the steady state during circuit operation is intentionally handled as macro parameters instead of finding such information from the body current characteristics based on elementary principles. By doing so, it is possible to omit the extraction of the SPICE parameters relating to the body current and a calculation that finds the steady state during circuit operation. This can be regarded as a reasonable means in view of the tradeoff between the calculation accuracy and the calculation time and convergence, which originates from the absolute value of the body current being small.

As one example, when calculating the propagation delay of a CMOS inverter circuit that is composed of a partially depleted SOI MOSFET, the fluctuation in the body charge observed in one cycle of actual circuit operation is thought to be sufficiently small so that transient analysis can be performed with macro parameters that estimate the body current at zero. When performing transient analysis for a normal short period, if the error tolerance parameters are set high, it is possible to easily prioritize both the calculation time and convergence.

Figure 2:
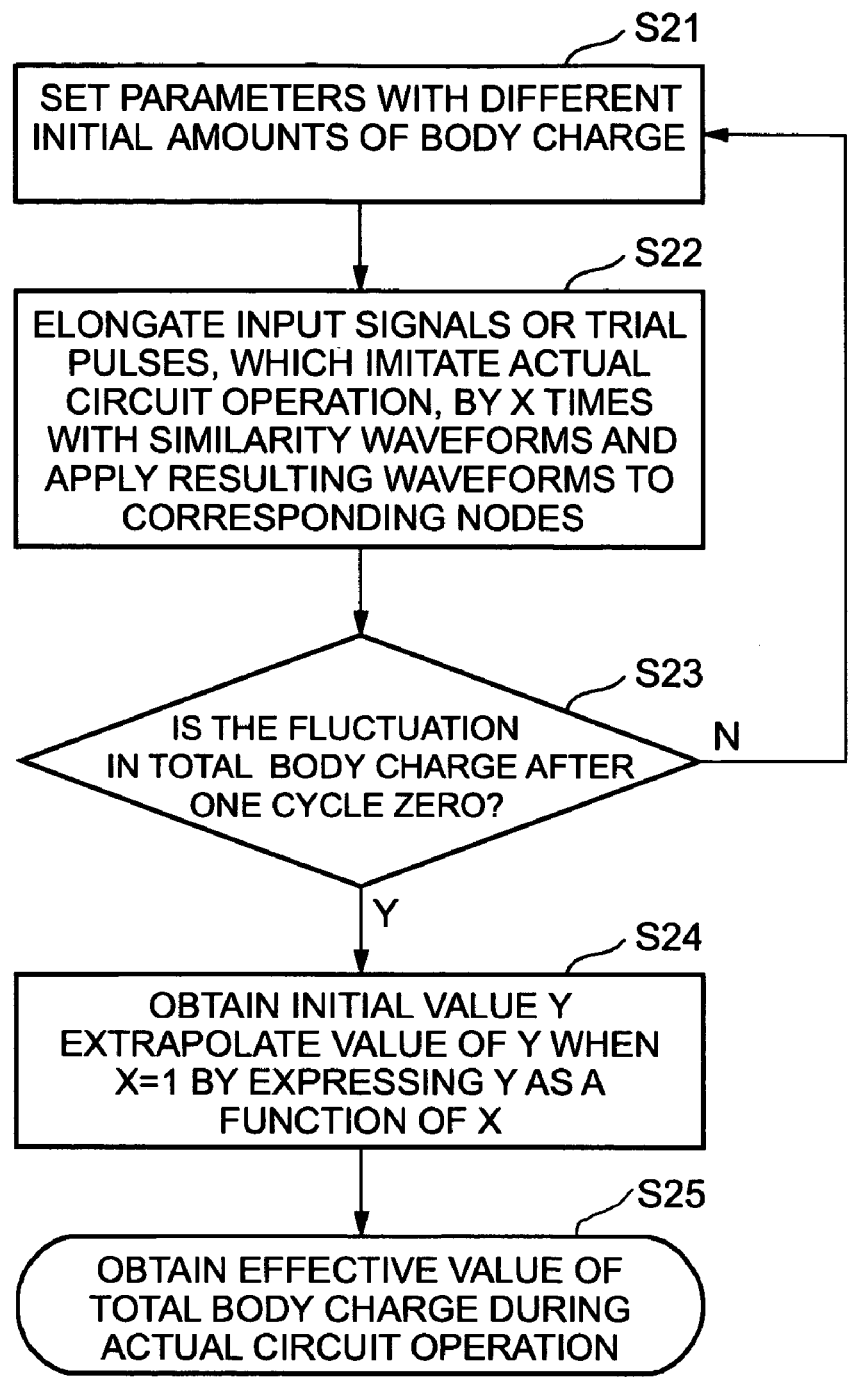
FIG. 2 is a flowchart showing a method of performing a SPICE calculation and device simulation for a partially depleted SOI MOSFET according to the second embodiment of the present invention.

FIG. 2 is a flowchart showing a method of performing a SPICE calculation and device simulation of a partially depleted SOI MOSFET according to a second embodiment of the present invention. Basically, in keeping with the article by A. Wei et al. in IEEE Trans. Electron Devices, vol. 45, pp. 430–438, 1998, a plurality of internal device states with different total amounts of body charge are prepared as the initial states for analysis (process S21). After this, input signals or trial pulses that imitate the actual circuit operation are applied to corresponding nodes and the initial body charge whose change after one cycle is zero (which is determined as the effective body charge though the following procedure) is used in the method of the present embodiment.

That is, as shown in process S22, for the input signals or trial pulses that imitate the actual circuit operation, the cycle is increased by "X" times to produce elongated waveforms with similarity forms. These waveforms are applied to the corresponding nodes. By doing so, the initial value "Y" for the total body charge at which the fluctuation after one cycle becomes zero is found (process S23). After this, Y is expressed as a function of X, and the value of Y when X=1 is extrapolated (process S24). In process S24, the extrapolated value of Y is determined to be the effective value of the total body charge during actual circuit operation.

According to the method of the present embodiment described above, during a SPICE calculation and device simulation for a partially depleted SOI MOSFET, the cycle of the input signals during actual circuit operation or of trial pulses that imitate such signals is increased by X times to form an elongated waveform for which an initial value "Y" of the total body charge is conserved. After this, the analysis result for the case where X=1, i.e., when the waveform is not elongated, is found by extrapolation. When the waveform is elongated, only the cycle is increased by X times, and the history pattern of the oscillations in the bias conditions is not changed. It is known that the initial value Y of the total body charge at which there is zero fluctuation in the total body charge after one cycle of the input signal is highly dependent on only the history pattern of the oscillations in the bias conditions. That is, the X dependency of the value Y is extremely small, which suggests that it will be extremely easy to extrapolate the value of Y for a case where X=1. Also, increasing the cycle of the oscillations in the bias conditions by X times means that the accuracy of the calculation of the total body charge is also increased by X times. Accordingly, the accuracy of the calculation can be increased without increasing the calculation time and the load of the calculation procedure.

Also, the accuracy of the calculation may be improved using the following method in place of the method described above. Both special values set with lower than a normal magnitude for calculation for the body, and values set with a normal magnitude that is used in a calculation for the nodes aside from the body are utilized as error tolerance parameters used as a convergence criterion of the SPICE calculation. According to this method, it is possible to perform the high accuracy calculation only for the body. By doing so, it is possible to cope with a situation when the body current and moreover the fluctuations in total body charge are extremely small and when it is necessary to perform the calculation of the total body charge and moreover the body potential with high accuracy. At the same time, since the calculation of the charging and discharging by the driving current at nodes aside from the body can be performed with normal accuracy, it can be said that this method is more efficient than performing a calculation based on all of the nodes, including the body, and the calculation is performed with high accuracy.

Figure 3:
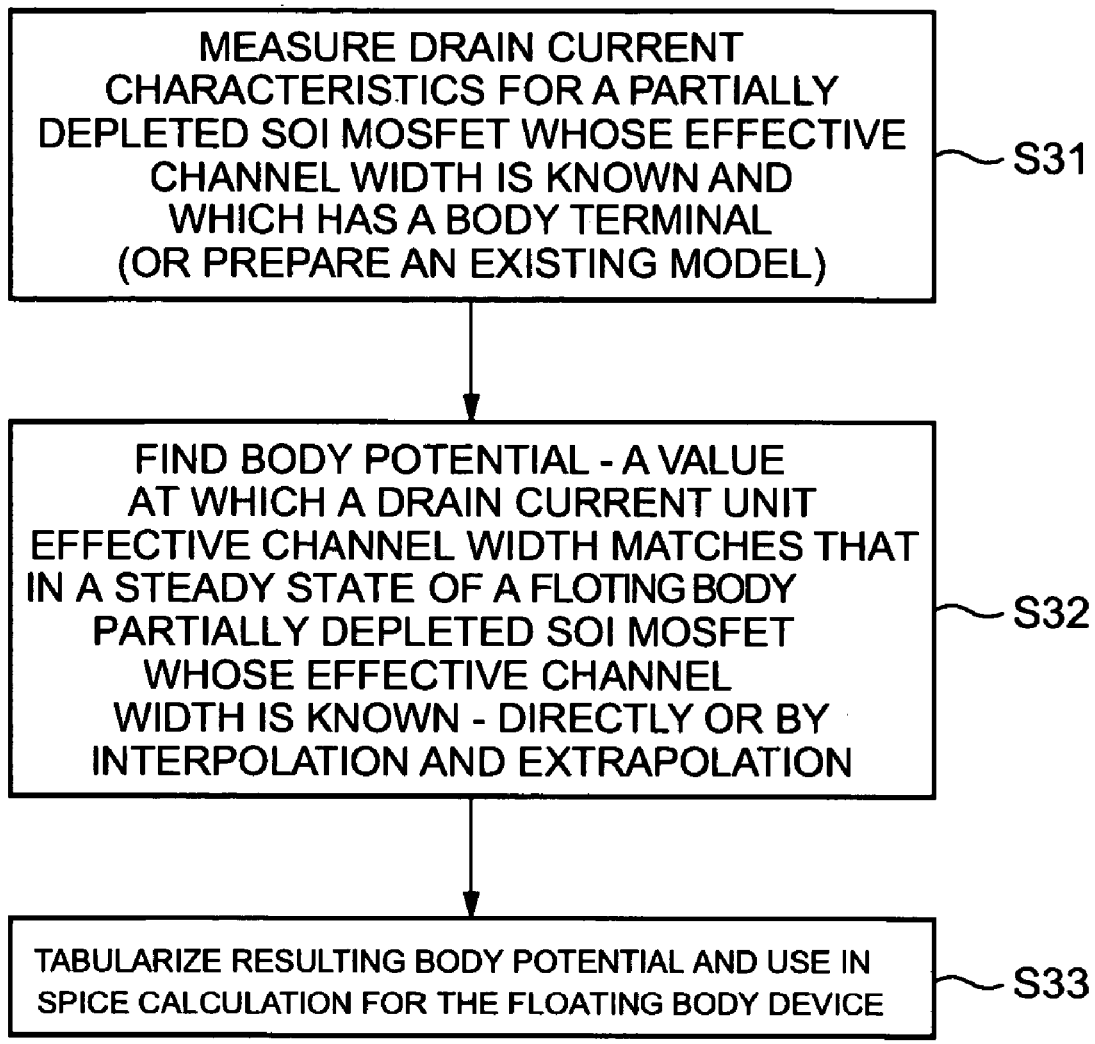
FIG. 3 is a flowchart showing a method of performing a SPICE calculation for a partially depleted SOI MOSFET according to the third embodiment of the present invention.

FIG. 3 is a flowchart showing the method of performing a SPICE calculation for a partially depleted SOI MOSFET according to a third embodiment of the present invention. In the first embodiment described above, in place of parameters that describe the body current characteristics, information regarding the steady state during circuit operation that is normally found from the body current characteristics, that is, the body charge and body potential oscillation, is treated as macro parameters that encompass information on the body current characteristics. On the other hand, in this third embodiment, a method is described where in place of parameters that describe the body current characteristics, the body potential not during the circuit operation but during what is normally referred to as the "steady state" is tabularized and used in a SPICE calculation.

The drain current characteristics are measured for a T-gate, H-gate or similar type of partially depleted SOI MOSFET for which the effective channel width is known and which is provided with a body terminal. Alternatively, if a model has been prepared for the same type of SOI MOSFET, such model is used (process S31). Then, the body potential—a value at which a drain current per unit effective channel width matches that in the steady state of a floating body partially depleted SOI MOSFET whose effective channel width is known—is found directly or through interpolation/extrapolation (process S32). In addition, the calculated body potential is tabularized and used in the analysis of the steady state for a floating body partially depleted SOI MOSFET (process S33).

With the method of the above embodiment, it is possible to calculate the body potential in the steady state, even when the body current has not been modeled as shown in the first embodiment. Accordingly, an increase in calculation efficiency can be expected.

According to the method of the present embodiment, in a transient analysis that takes the body current into account, the electrical characteristics during circuit operation are heavily dependent on the error tolerance parameters used during the convergence determination of a SPICE calculation. Also, a measure that sets the error tolerance parameters low to increase the accuracy of a SPICE calculation sacrifices calculation time and convergence, and is not necessarily effective. In contrast, by estimating the body current at zero and performing transient analysis with macro parameters, the error tolerance parameters are set high and the calculation time and convergence are prioritized. The total body charge is determined so as to be appropriate for the propagation delay resulting from actual measurement, and a suitable oscillation pattern for the body potential is determined. By doing so, SPICE calculations can be made more efficient. It should be noted that for a partially depleted SOI MOSFET provided with a terminal in the body, in cases where the body resistance and circuit operating frequency are both sufficiently high for transient capacitive coupling to occur, it is possible to increase efficiency with exactly the same procedure.

Also, by increasing the cycle of the input signals or trial pulses that imitate the actual circuit operation, invariance in the total charge of the body after one cycle of circuit operation is found and invariance for a case when the cycle is thereafter returned to normal is found by extrapolation. By doing so, accuracy is improved. Alternatively, both special values set with lower than a normal magnitude for calculation for the body, and values set with a normal magnitude that are used in the calculation for the nodes aside from the body may be utilized as error tolerance parameters used as a convergence criterion of a SPICE calculation. It is also possible to calculate the body potential in the steady state in advance and to tabularize and use the results in a SPICE calculation for the steady state.

As described above, according to the present invention, instead of finding information regarding the steady state during circuit operation from the body current characteristics based on fundamental principles, the body current is estimated at zero, and the same information is treated as macro parameters. By doing so, it is possible to omit the extraction of SPICE parameters relating to the body current characteristics and a calculation that finds the steady state during circuit operation. In view of the tradeoff between the calculation accuracy and the calculation time and convergence, which originates from the absolute value of the body current being small, this means can be regarded as reasonable.

Also, by increasing the cycle of the input signals or trial pulses that imitate the actual circuit operation, invariance in the total charge of the body after one cycle of circuit operation is found and invariance for a case when the cycle is thereafter returned to normal is found by extrapolation. By doing so, accuracy is improved. Alternatively, both special values set for the calculation for the body that is with lower than a normal magnitude and values set with a normal magnitude that are used in the calculation for the nodes aside from the body may be utilized as the error tolerance parameters used as a convergence criterion of a SPICE calculation. It is also possible to calculate the body potential in the steady state in advance and to tabularize and use the results in a SPICE calculation of the steady state. As a result, it is possible to improve the efficiency of the procedures for SPICE parameter extraction, SPICE calculation, and device simulation for a partially depleted SOI MOSFET.

The entire disclosure of Japanese Patent Application No. 2002-345823 filed Nov. 28, 2002 is incorporated by reference.

What is claimed is:

1. A method of performing a SPICE calculation and device simulation for a partially depleted SOI MOSFET formed on an SOI substrate comprising:
    increasing an input signal cycle and one of an output load capacitance and an output load resistance by a ratio X, wherein the ratio X is a ratio of an increased value of one of the input signal cycle, the output load capacitance, and the output load resistance to an initial value of one of the input signal cycle, the output load capacitance, and the output load resistance;
    finding an initial value Y of a total body charge at which there is zero fluctuation in the total body charge after one input signal cycle; and
    extrapolating a value of Y for when X=1 by expressing Y as a function of X to find a steady state during circuit operation of a partially depleted SOI MOSFET.

2. A method of performing a SPICE calculation and device simulation for a partially depleted SOI MOSFET formed on an SOI substrate comprising:
    increasing a cycle of trial pulses that imitate actual circuit operation by "X" times to extend the trial pulses with similarity waveforms;
    finding an initial value "Y" of a total body charge at which there is zero fluctuation in the total body charge after one trial pulse cycle; and
    extrapolating a value of Y for when X=1 by expressing Y as a function of X;
    extrapolating a value of Y for when X=1 by expressing Y as a function of X to find a steady state during circuit operation of a partially depleted SOI MOSFET.

* * * * *